(12) United States Patent
Cheng et al.

(10) Patent No.: US 7,514,278 B2
(45) Date of Patent: Apr. 7, 2009

(54) TEST-KEY FOR CHECKING INTERCONNECT AND CORRESPONDING CHECKING METHOD

(75) Inventors: Yeh-Sheng Cheng, Yunlin County (TW); Hsueh-Wen Wang, Hsinchu (TW); Shu-Yun Liao, Hsinchu (TW); Chih-Ying Chien, Nantou County (TW); Hsin-Yu Lu, Taichung (TW); Rui-Huang Cheng, Taipei County (TW)

(73) Assignee: United Microelectronics Corp., Hsinchu (TW)

( * ) Notice: Subject to any disclaimer, the term of this patent is extended or adjusted under 35 U.S.C. 154(b) by 513 days.

(21) Appl. No.: 11/162,113

(22) Filed: Aug. 29, 2005

(65) Prior Publication Data

US 2007/0049049 A1    Mar. 1, 2007

(51) Int. Cl.
*G01R 31/26* (2006.01)
*H01L 21/66* (2006.01)

(52) U.S. Cl. ............... 438/17; 438/401; 438/462; 257/797; 257/E21.521

(58) Field of Classification Search ............ 438/401, 438/462, 17; 257/797, E21.521
See application file for complete search history.

(56) References Cited

U.S. PATENT DOCUMENTS

| 6,037,668 | A  | * | 3/2000  | Cave et al. .............. 257/784 |
| 6,313,024 | B1 | * | 11/2001 | Cave et al. .............. 438/598 |
| 6,989,682 | B1 | * | 1/2006  | Shen et al. ............... 324/763 |
| 2002/0037651 | A1 | * | 3/2002 | Lee ........................ 438/710 |

* cited by examiner

*Primary Examiner*—George Fourson
*Assistant Examiner*—John M Parker
(74) *Attorney, Agent, or Firm*—Jianq Chyun IP Office

(57) ABSTRACT

A test key for checking an interconnect structure is described, including a contiguous metal line and multiple conductive plugs on the contiguous metal line, wherein one end of each plug contacts with the contiguous metal line. The other end of at least one plug is not connected to any conductor. In addition, the two ends of the contiguous metal line are connected to different voltages.

11 Claims, 5 Drawing Sheets

TEST-KEY FOR CHECKING INTERCONNECT AND CORRESPONDING CHECKING METHOD

BACKGROUND OF THE INVENTION

1. Field of the Invention

The present invention relates to tests of integrated circuits. More particularly, the present invention relates to a structure of a test key for checking an interconnect structure, and to a method for checking an interconnect structure using the test key.

2. Description of the Related Art

In a multi-level interconnect process of a semiconductor process, many test key are usually formed in the scribe line regions of the wafer for checking the electrical connections between the conductive plugs and the overlying and underlying conductive lines of the interconnect structure.

FIG. 1 illustrates a prior-art test key and a corresponding interconnect structure. The interconnect structure and the test key 106 are formed in a device area 102 and in a scribe line area 104, respectively, of a substrate 100. The test key 106 is constituted of lower metal layers 110b, plugs 150b and upper metal layers 160b. The upper and lower metal layers 110b and 160b are arranged alternately, wherein each upper (lower) metal layer 160b (110b) is connected to two lower (upper) metal layers 110b (160b) via two plugs 150b to form a contiguous conductive structure.

The metal layers 110b are formed simultaneously with the lower metal layers 110a, the plugs 150b are formed together with the plugs 150a, and the metal layers 160b are formed together with the upper metal layers 160a of the interconnect structure. Usually, after the metal layers 110a/b are formed, a thin oxide layer 120 is formed all over the substrate 100, the gaps between the metal layers 110a/b is filled with spin-on glass (SOG) 130, and then an oxide layer 140 is formed covering the metal layers 110a/b and the SOG 130. Thereafter, via holes 146a/146b are formed in the oxide layer 140 in the device area 102/scribe line area 104 and then filled with metal to form plugs 150a/150b. In addition, as shown in FIG. 2, to make the metal filling easier, a wet etching step using buffered oxide etchant (BOE) and using the photoresist patterns 142 for defining the via holes 146a/b as a mask is usually conducted before the via holes 146a/b are defined to form wider cavities 144a/b above the via holes 146a/b.

To check the interconnect structure, the electromigration (EM) destruction time of the test key 106 can measured. If the plugs 150a of the interconnect structure have defects, the plugs 150b formed simultaneously with the plugs 150a should also have defects. Thus, the EM destruction time of the test key 106 will be reduced allowing the problem to be detected.

However, the problems of the metal layers 110a cannot be reflected by the conventional test key 106. For example, when the gap between two metal layers 110a is overly narrow or the gap-filling property of the raw material of the SOG 130 is poor, a seam 133 (FIG. 2) easily occurs in the SOG 130 and extends through the oxide layers 120 and 140 so that the metal layers 110a are corroded in the BOE etching for forming the cavities 144a/b, as shown in FIG. 2. Such corrosion of the metal layers 110a cannot be indicated by using the conventional test key 106.

SUMMARY OF THE INVENTION

Accordingly, this invention provides a test key for checking an interconnect structure, which can indicate corrosion of the metal layers of the interconnect structure.

This invention also provides a method for checking an interconnect structure, which utilizes the test key of this invention.

The test key of this invention includes a contiguous metal line and multiple conductive plugs on the contiguous metal line, wherein one end of each plug contacts with the contiguous metal line. The other end of at least one plug is not connected to any conductor. In addition, the two ends of the contiguous metal line are coupled to different voltages.

In a preferred embodiment of this invention, spin-on glass (SOG) is disposed beside the contiguous metal line of the test key, wherein the contiguous metal line is preferably separated from the SOG by a first dielectric layer. A second dielectric layer may be disposed on the contiguous metal line and SOG, while the plugs are embedded in the second dielectric layer. The top portion of each plug may be wider than the other portions thereof, wherein the lower surface of the top portion has a shape caused by selective isotropic etching to the second dielectric layer.

The test key may further include at least two dummy patterns that are disposed beside the contiguous metal line and apart from the same by a distance, while the distance is preferably the distance between two adjacent metal layers in the interconnect structure that are at the same level of the contiguous metal line. The material of the dummy patterns may be the same as that of the contiguous metal line. In addition, the test key is preferably formed in a scribe line area of the wafer, and the material of the plugs may be aluminum (Al).

In another embodiment, the test key for checking an interconnect structure of this invention includes a first, a second and a third contiguous metal lines, multiple conductive plugs and an upper metal layer. The first to third contiguous metal lines are arranged sequentially and are parallel to each other. The conductive plugs are disposed on the first and the third contiguous metal lines, wherein the lower end of each conductive plug contacts with the first or third contiguous metal line. The upper metal layer is disposed over the first to third contiguous metal lines and the conductive plugs, contacting with the upper end of each conductive plug. The two ends of the second contiguous metal line are coupled to different voltages for test.

In the method for checking an interconnect structure of this invention, a contiguous metal line is formed in a scribe line area of a wafer simultaneously with the metal layers of the interconnect structure, and second plugs are formed on the contiguous metal line simultaneously with the first plugs of the interconnect structure, wherein the contiguous metal line and the second plugs together constitute a test key. Then, different voltages are applied to the two ends of the contiguous metal line to measure an electromigration (EM) property, such as an EM-destruction time, of the contiguous metal line, so as to derive the state of the interconnect structure.

In a preferred embodiment, SOG is further formed between the metal layers of the interconnect structure and beside the contiguous metal line after the metal layers and the contiguous metal line are formed. Before the SOG is formed, a first dielectric layer is preferably formed covering the surfaces of the metal layers and the contiguous metal line to protect them from being damaged by the raw material of the SOG. After the SOG is formed, a second dielectric layer may be formed on the metal layers, the contiguous metal line and the SOG, while the first and the second plugs are formed in the second dielectric layer.

In the above preferred embodiment, the method of forming the first and second plugs in the second dielectric layer may include the following steps. A patterned mask layer with via-hole patterns therein is formed over the second dielectric layer, and then an isotropic etching step is conducted to the second dielectric layer using the mask layer as a mask to form cavities on the same. An anisotropic etching step is then conducted to the second dielectric layer using the same mask layer as a mask to form via holes in the second dielectric layer, and metal is filled into the via holes and the cavities to form the plugs. The second dielectric layer may include silicon oxide, while the isotropic etching step may use BOE as an etchant.

Moreover, in the step of forming the contiguous metal line in the scribe line area, at least two dummy patterns may be simultaneously formed beside the contiguous metal line, wherein each of the at least two dummy patterns is apart from the contiguous line by a distance. The distance is preferably equal to the distance between two adjacent metal layers in the interconnect structure to well simulate the interconnect structure. In addition, the material of the first and the second plugs may be aluminum (Al).

In another embodiment of the method for checking an interconnect structure of this invention, the interconnect structure further includes multiple first upper metal layers contacting with the first plugs. In this embodiment, a first, a second and a third contiguous metal lines are formed in a scribe line area of the wafer simultaneously with formation of the lower metal layers, wherein the first to third contiguous metal lines are arranged sequentially and are parallel to each other. Multiple second plugs are formed on the first and third contiguous metal lines simultaneously with formation of the first plugs. Then, a second upper metal layer is formed simultaneously with formation of the first upper metal layers, wherein the first to third contiguous metal lines, the second plugs and the second upper metal layer together constitute a test key. Thereafter, different voltages are applied to the two ends of the second contiguous metal line to measure an electromigration property of the second contiguous metal line, so as to derive the state of the interconnect structure.

Since the test key of this invention includes a contiguous metal line and an EM property of the metal line is measured for checking, when the contiguous metal line is corroded, the change of the EM property of the test key is much larger as compared with the case where the test key is constituted of alternately arranged upper and lower metal layers and plugs with the lower metal layers being corroded. Hence, when the circuit structure and/or process conditions cause the interconnect metal layers and the contiguous metal line to be corroded, such a problem can be readily indicated by the change of the EM property of the contiguous metal line.

It is to be understood that both the foregoing general description and the following detailed description are exemplary, and are intended to provide further explanation of the invention as claimed.

DESCRIPTION OF THE PREFERRED EMBODIMENTS

Figure 3A:
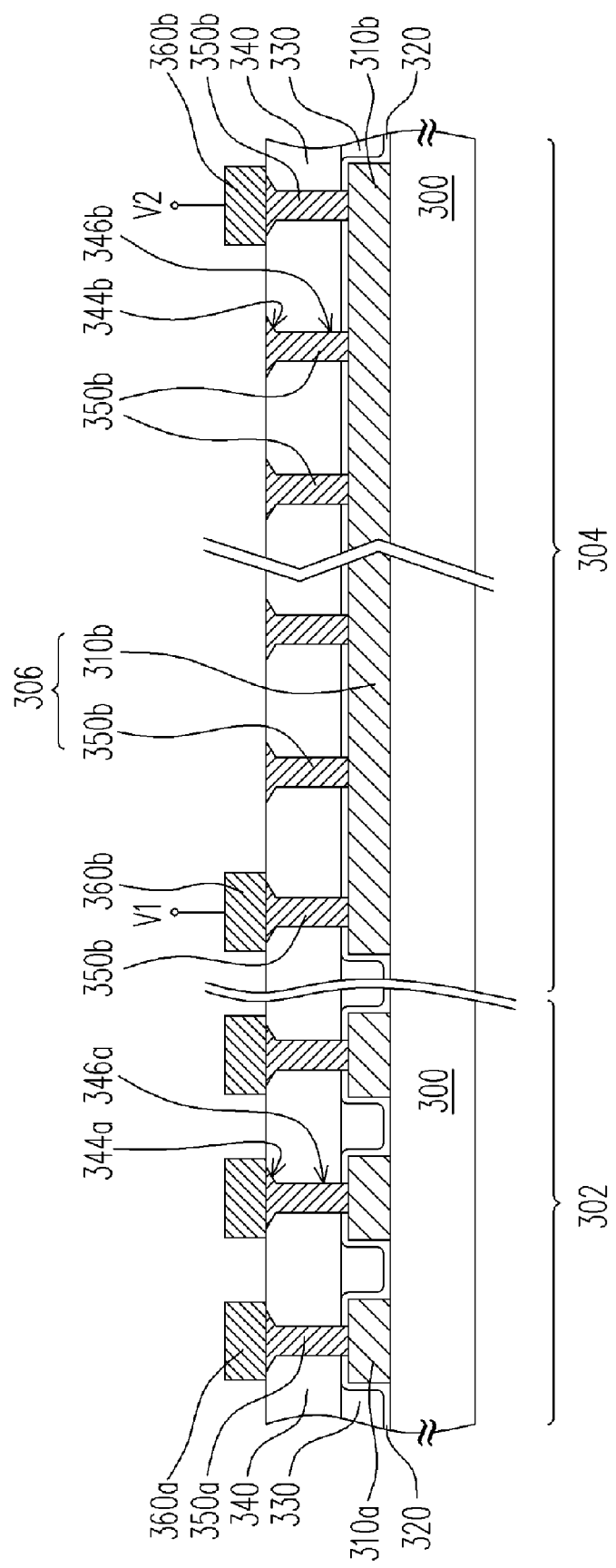
FIG. 3A illustrates a test key structure and a corresponding interconnect structure according to a preferred embodiment of this invention in a cross-sectional view.
Figure 3B:
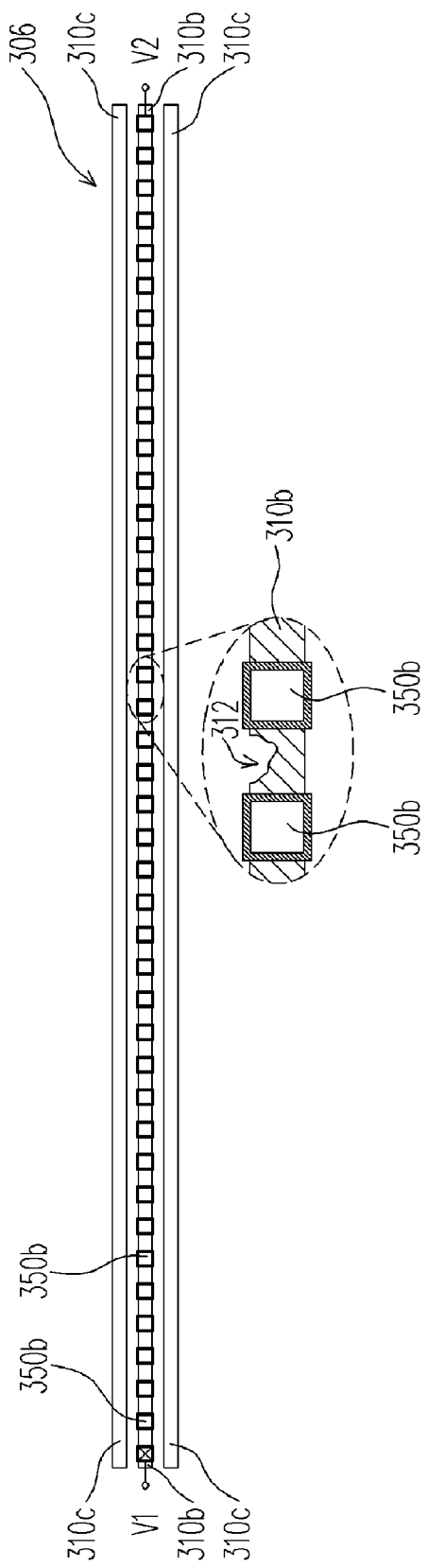
FIG. 3B illustrates a top view of the test key.

FIGS. 3A-3B illustrate the test key and a corresponding interconnect structure according to the preferred embodiment of this invention, while a fabricating process of the test key and the interconnect structure is described as follows also referring to FIGS. 3A-3B. A wafer/substrate 300 with a device area 302 and a scribe line area 304 thereon is provided. An interconnect structure is to be formed in the device area 302 and a test key and other testing patterns and/or alignment marks (not shown) are to be formed in the scribe line area 304. At first, metal layers 310a are formed in the device area 302, and a contiguous metal line 310b is simultaneously formed in the scribe line area 304. A thin dielectric layer 320 is then formed all over the substrate 300. The material of the metal layers 310a and the contiguous metal line 310b may be aluminum (Al), and the thin dielectric layer 320 may include an inorganic dielectric material formed through CVD, such as CVD-oxide, to protect the metal layers 310a and the contiguous metal line 310b from being damaged by the raw material of the spin-on glass (SOG) that will be applied later.

Moreover, as shown in FIG. 3B, in the step of forming the metal layers 310a and the contiguous metal line 310b, at least two dummy patterns 310c may be formed beside the contiguous metal line 310b to well simulate the interconnect structure. Each dummy pattern 310c may be a metal line having the same width of the contiguous metal line 310b, and is apart from the same by a distance. The distance is preferably equal to the distance between two adjacent metal layers 310a of the interconnect structure, so as to better simulate the interconnect structure. Thus, the SOG later filled in the gap between two metal layers 310a and that filled in the gap between the contiguous metal line 310b and the dummy patterns 310c can have the same state, for example, the same probability in occurrence of seams.

Figure 1:
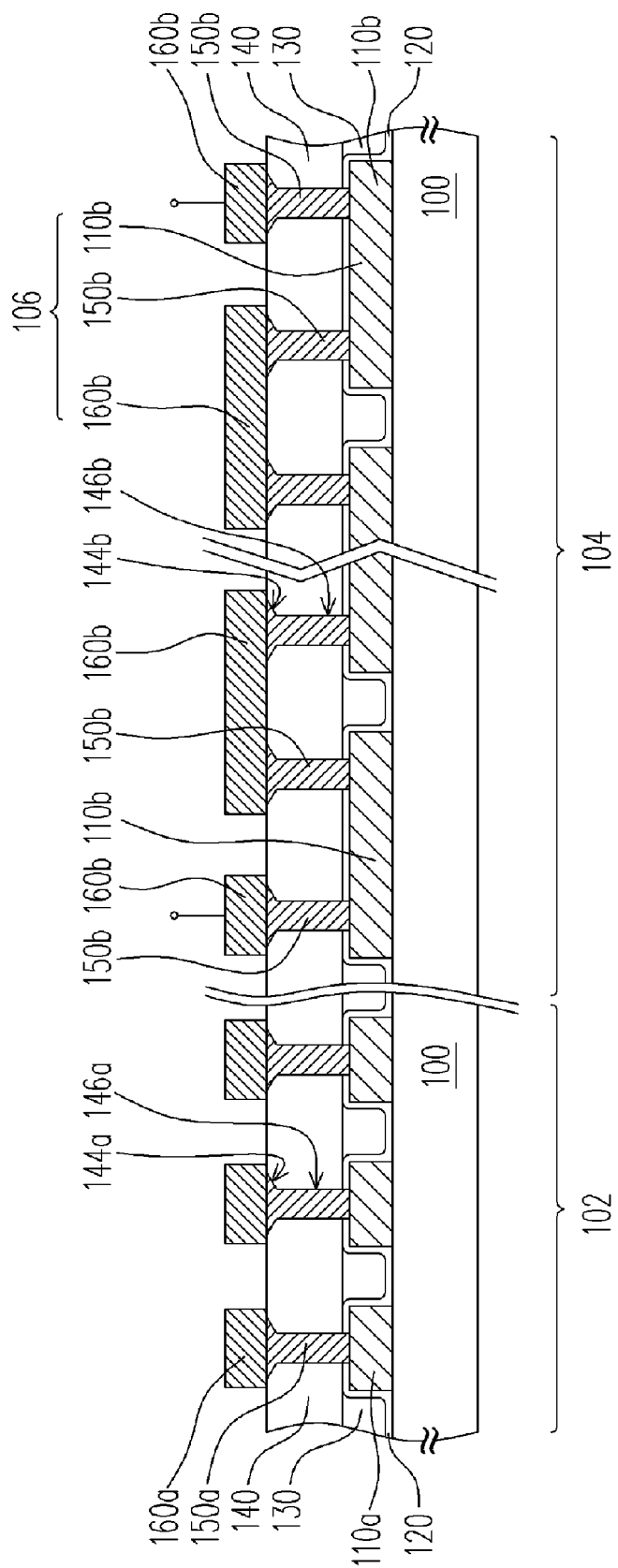
FIG. 1 illustrates a prior-art test key and a corresponding interconnect structure.
Figure 2:
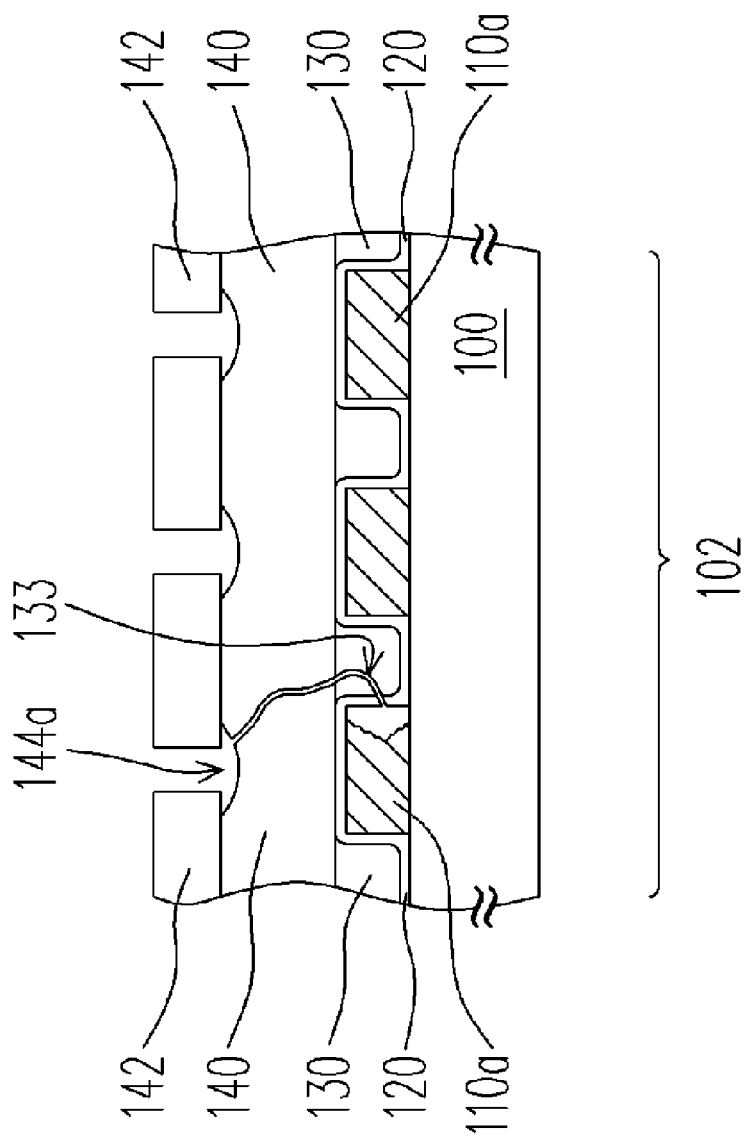
FIG. 2 illustrates that the metal layers of the interconnect structure are corroded because of the seams in the SOG.

Then, SOG 330 is filled in the gaps between the metal layers 310a and in the gaps between the metal line 310b and the dummy patterns 310c for planarization, wherein the material of the SOG 330 may be HSQ and MSQ. A dielectric layer 340 is then formed over the metal layers 310a, the contiguous metal line 310b and the SOG 330, wherein the material of the dielectric layer 340 is, for example, CVD-oxide. A mask layer having multiple via-hole patterns therein (not shown, but is similar to "142" in FIG. 2) is formed on the dielectric layer 340, and then an isotropic etching step is performed to form cavities 344a on the dielectric layer 340 in the device area 302 and cavities 344b on the dielectric layer 340 in the scribe line area 304, wherein the etchant used may be buffered oxide etchant (BOE) that contains HF and NH4F. The cavities 344a/b are formed for expanding the top portion of each via hole to facilitate the filling of metal, especially a metal of poor step-coverage capability like aluminum (Al).

Thereafter, an anisotropic etching step is conducted using the same mask layer as a mask to form via holes 346a in the device area 302 and via holes 346b in the scribe line area 304. The cavities 344a/b and the via holes 346a/b are then filled with a metal, such as Al or copper (Cu), to form plugs 350a in the dielectric layer 340 in the device area 302 connecting with the metal layers 310a and plugs 350b in the dielectric layer 340 in the scribe line area 304 connecting with the contiguous metal line 310b, wherein the contiguous metal line 310b and the plugs 350b together constitute a test key 306. Then, metal layers 360a connecting with the plugs 350a are formed on the dielectric layer 340 in the device area 302, and metal layers 360a are formed on the dielectric layer 340 in the scribe line area 304. The metal layers 360b are formed connecting with the plugs 350b located on the two ends of the contiguous metal line 310b, so that the metal line 310b can be connected to a testing apparatus. The other plugs 350b may connect to no conductor at the other end thereof, or may include some plugs connected to other metal patterns (not shown) formed together with the metal layers 360a/b for testing the conductive plugs 350a.

When the interconnect structure formed in the device area 302 is required to check, different voltages V1 and V2 are respectively applied to the two ends of the contiguous metal line 310b such that electromigration (EM) effect is induced, and an EM property like an EM destruction time is measured. The EM destruction time means a time period required to destroy the contiguous metal line 310b under a certain EM condition. When the inter-metal gap is overly narrow and/or the gap-filling effect of the raw material of the SOG 330 is poor to cause seams in the dielectric layer such that the metal line 310 is corroded in subsequent wet etching to form a breach 312 therein like the metal layers 310a is, the EM destruction time of the contiguous metal line 310 will be much reduced to clearly indicate the state of the metal layers 310a.

Figure 4:
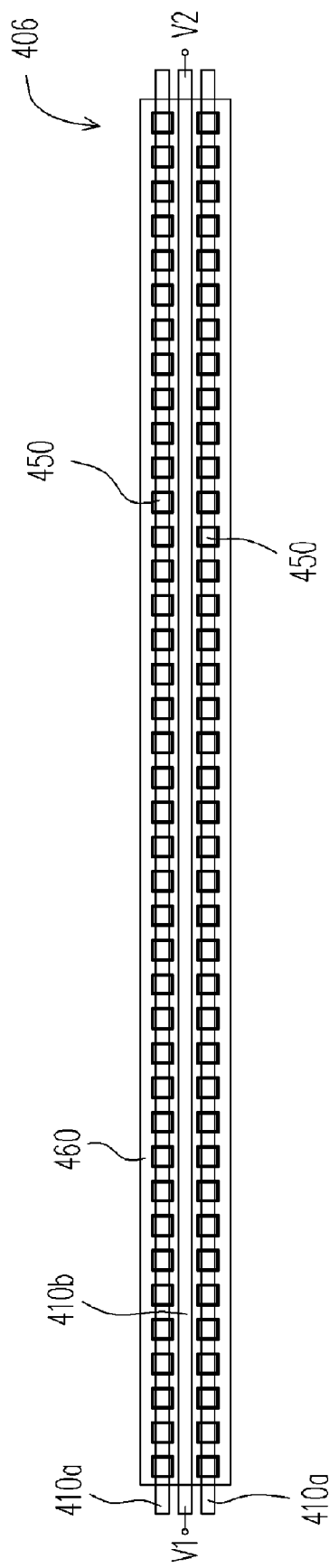
FIG. 4 illustrates a top view of a test key structure according to another preferred embodiment of this invention.

Besides, FIG. 4 illustrates a top view of a test key structure according to another preferred embodiment of this invention. The test key includes a contiguous metal line 410b, two contiguous metal lines 410a beside 410b, conductive plugs 450 on the two contiguous metal lines 410a, and an upper meal layer 460 over the three contiguous metal lines 410a/b and the conductive plugs 450. The lower end of each conductive plug 450 contacts with a contiguous metal lines 410a, and the upper end of the same contacts with the upper meal layer 460.

Similarly, the gaps between the contiguous metal lines 410a and 410b may be filled with spin-on glass (SOG), the contiguous metal lines 410a/b may be separated from the SOG by a thin inorganic dielectric layer, and the conductive plugs 450 may be disposed in a dielectric layer formed over the contiguous metal lines 410a and 410b and the SOG. Thus, in the wet-etching step for expanding the top portions of the via holes holding the conductive plugs 450, the corrosive liquid may corrode the contiguous metal lines 410a and 410b through the seams in the SOG and the dielectric layer (not shown), as in the precedent embodiment.

However, the test key is different from that of the precedent embodiment in that the different voltages V1 and V2 are applied to the two ends of the contiguous metal lines 410b on which dense conductive plugs 450 are not formed. The functioning mechanism of this test key is the same as that of the test key 306 in FIG. 3B, but this test key is better than the latter in the sensitivity to metal corrosion.

In addition, to form simultaneously the interconnect structure at the left part of FIG. 3A and the test key in FIG. 4, the contiguous metal lines 410a and 410b can be formed simultaneously with the metal layers 310a, the conductive plugs 450 can be formed simultaneously with the conductive plugs 350a, and the upper metal layer 460 can be formed simultaneously with the metal layers 360a.

As mentioned above, the test key of this invention includes a contiguous metal line, and an EM property of the metal line is measured in the test. Therefore, when corrosion occurs to metal layers as mentioned above, the change of the EM property of the test key is much larger than that of the prior-art test key. Hence, when the circuit structure and/or process conditions cause seams to occur such that the metal layers of the interconnect and the metal line of the test key are corroded in any subsequent wet etching step, such a problem can be readily indicated by the change of the EM property of the test key of this invention.

Furthermore, though in the preferred embodiment the test key of this invention is used to detect corrosion of the interconnect metal layers caused by the seams in the SOG and by the wet etching step for expanding the top portions of the via holes, the application of this invention is not restricted to this. Whenever the interconnect metal layers are possibly corroded, in any other kind of wet etching step because of a seam in SOG or other dielectric material, or in any subsequent wet-etching step or any other step for any possible reason, the test key of this invention can be used for checking the interconnect structure.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for checking an interconnect structure that is formed on a wafer and includes a plurality of metal layers and a plurality of first plugs on the metal layers, comprising:
    forming a contiguous metal line in a scribe line area of the wafer simultaneously with formation of the metal layers;
    forming a plurality of second plugs on the contiguous metal line simultaneously with formation of the first plugs, wherein the second plugs and the contiguous metal line together constitute a test key; and
    applying different voltages to two ends of the contiguous metal line to measure an electromigration property of the contiguous metal line, so as to derive a state of the interconnect structure.

2. The method of claim 1, wherein the electromigration property comprises an electromigration destruction time of the contiguous metal line.

3. The method of claim 1, wherein after the metal layers and the contiguous metal line are formed, spin-on glass is formed between the metal layers and beside the contiguous metal line.

4. The method of claim 3, wherein before the spin-on glass is formed, a first dielectric layer is formed on surfaces of the metal layers and the contiguous metal line.

5. The method of claim 3, wherein after the spin-on glass is formed, a second dielectric layer is formed on the metal layers, the contiguous metal line and the spin-on glass, while the first and the second plugs are formed in the second dielectric layer.

6. The method of claim 5, wherein the step of forming the first and the second plugs in the second dielectric layer comprises:
    forming a patterned mask layer with a plurality of via-hole patterns therein over the second dielectric layer;
    conducting an isotropic etching step to the second dielectric layer with the mask layer as a mask, so as to form a plurality of cavities on the second dielectric layer;

conducting an anisotropic etching step to the second dielectric layer with the mask layer as a mask, so as to form a plurality of via holes in the second dielectric layer; and filling metal into the via holes and the cavities to form the first and the second plugs.

7. The method of claim 6, wherein the second dielectric layer comprises silicon oxide, and the isotropic etching step uses buffered oxide etchant(BOE) as an etchant.

8. The method of claim 1, further comprising:

forming at least two dummy patterns beside the contiguous metal line in the step of forming the contiguous metal line, wherein each of the at least two dummy patterns is apart from the contiguous line by a distance.

9. The method of claim 8, wherein the distance is a distance between two, adjacent metal layers in the interconnect structure.

10. The method of claim 1, wherein the first and the second plugs comprise aluminum (Al).

11. A method for checking an interconnect structure that is formed on a wafer and includes a plurality of lower metal layers, a plurality of first plugs on the lower metal layers and a plurality of first upper metal layers contacting with the first plugs, comprising:

forming a first, a second and a third contiguous metal lines in a scribe line area of the wafer simultaneously with formation of the lower metal layers, wherein the first to third contiguous metal lines are arranged sequentially and are parallel to each other;

forming a plurality of second plugs on the first and third contiguous metal lines simultaneously with formation of the first plugs;

forming a second upper metal layer simultaneously with formation of the first upper metal layers, wherein the first to third contiguous metal lines, the second plugs and the second upper metal layer together constitute a test key; and applying different voltages to two ends of the second contiguous metal line to measure an electromigration property of the second contiguous metal line, so as to derive a state of the interconnect structure.

\* \* \* \* \*